(12) United States Patent
Copel et al.

(10) Patent No.: US 11,737,373 B2
(45) Date of Patent: Aug. 22, 2023

(54) SILICIDE PASSIVATION OF NIOBIUM

(71) Applicant: INTERNATIONAL BUSINESS MACHINES CORPORATION, Armonk, NY (US)

(72) Inventors: Matthew W. Copel, Yorktown Heights, NY (US); James B. Hannon, Mahopac, NY (US); Adam M. Pyzyna, Cortlandt Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 336 days.

(21) Appl. No.: 17/039,398

(22) Filed: Sep. 30, 2020

(65) Prior Publication Data
US 2022/0102614 A1 Mar. 31, 2022

(51) Int. Cl.
| | | |
|---|---|---|
| *H10N 60/01* | (2023.01) | |
| *C23C 14/00* | (2006.01) | |
| *H10N 60/12* | (2023.01) | |
| *H10N 60/85* | (2023.01) | |
| *H10N 69/00* | (2023.01) | |
| *C23C 14/06* | (2006.01) | |
| *C23C 14/02* | (2006.01) | |

(52) U.S. Cl.
CPC ..... *H10N 60/0128* (2023.02); *C23C 14/0036* (2013.01); *H10N 60/0912* (2023.02); *H10N 60/12* (2023.02); *H10N 60/85* (2023.02); *H10N 69/00* (2023.02); *C23C 14/02* (2013.01); *C23C 14/0682* (2013.01)

(58) Field of Classification Search
CPC .... H10N 60/0912; H10N 60/12; H10N 60/85; H10N 60/0128
See application file for complete search history.

(56) References Cited

U.S. PATENT DOCUMENTS

| | | |
|---|---|---|
| 4,490,733 A | 12/1984 | Kroger |
| 4,956,337 A | 9/1990 | Ogushi |
| H873 H | 1/1991 | Cukauskas et al. |
| 7,151,347 B1 | 12/2006 | Myneni et al. |
| 9,455,391 B1 | 9/2016 | Nayfeh et al. |

(Continued)

OTHER PUBLICATIONS

David Olaya et al., "Planarized Process for Single-Flux-Quantum Circuits With Self-Shunted Nb/NbxSi1?x/Nb Josephson Junctions" IEEE Transactions on Applied Superconductivity, Sep. 2019, vol. 29, Issue: 6, pp. 1-8.

(Continued)

*Primary Examiner* — Sherman Ng
(74) *Attorney, Agent, or Firm* — Amin, Turocy & Watson, LLP (57) ABSTRACT

A superconducting device which includes a substrate, multiple niobium leads formed on the substrate, a niobium silicide ($NbSi_x$) passivation layer formed on a surface of at least one of the multiple niobium leads, and an aluminum lead formed directly on at least a portion of the $NbSi_x$ passivation layer such that an interface therebetween is substantially free of oxygen and oxidized material, where the multiple niobium leads and the aluminum lead are constructed to carry a supercurrent while in use.

8 Claims, 12 Drawing Sheets

(56) References Cited

U.S. PATENT DOCUMENTS

| | | |
|---|---|---|
| 9,947,582 B1 | 4/2018 | Kuroda et al. |
| 10,109,673 B2 | 10/2018 | Tolpygo |
| 2003/0107033 A1* | 6/2003 | Tzalenchuk ........... G06N 10/00 |
| | | 257/30 |
| 2012/0219824 A1 | 8/2012 | Prolier et al. |
| 2017/0084813 A1* | 3/2017 | Chang .................... H10N 69/00 |
| 2019/0042963 A1* | 2/2019 | Abraham ........... H10N 60/0912 |
| 2019/0296213 A1* | 9/2019 | Brink ..................... H10N 69/00 |
| 2020/0028062 A1* | 1/2020 | Rosen .................... H10N 60/12 |

OTHER PUBLICATIONS

Heslinga, D. R. et al, "Schottky barrier and contact resistance at a niobium/silicon interface.", Applied Physics Letters, Mar. 13, 1989, 54(11), 1048-1050.

M Vilasi et al., "New silicides for new niobium protective coatings", Journal of Alloys and Compounds, 264, 244 (1998).

Dolan "Offset masks for lift-off photoprocessing", Applied Physics Letters, 31, 337(1977), https://doiorg/1 0.1063/1.89690, Published Online: Aug. 26, 2008.

\* cited by examiner

SILICIDE PASSIVATION OF NIOBIUM

BACKGROUND

The presently claimed embodiments of the current invention relate to superconducting devices, and more specifically, to superconducting devices that include overlapping superconducting niobium and aluminum.

Some quantum computing devices are based on superconducting qubits. Such superconducting qubits are often superconducting oscillator circuits that have quantized oscillation states. The difference in frequency between the lowest oscillation state of the circuit and the next higher oscillation state is referred to as the frequency of the superconducting qubit. It is an excitation frequency, related to excitation energy, of the circuit. Many superconducting qubits have one or more Josephson junctions as part of their circuits. The specific structures of the Josephson junctions within the circuits are related to the frequency of the superconducting qubit.

Deployment of quantum devices with Josephson junctions, such as transmission line shunted plasma oscillation ("transmon") qubit chips for quantum computation applications, requires strict margins for the frequency detuning between qubit pairs. The same considerations apply to other types of quantum devices that include Josephson junctions, such as amplifiers, filters, and resonators.

Many superconducting devices use niobium and aluminum superconducting leads including overlapping portions of the niobium and aluminum. For example, qubit chips may include several qubits on the chip as well as conducting leads to address the qubits. The qubits often use superconducting aluminum in their structure which overlap with niobium leads on the same chip.

SUMMARY

An embodiment of the present invention relates to a superconducting device which includes a substrate, multiple niobium leads formed on the substrate, a niobium silicide ($NbSi_x$, where in some embodiments the value of x is in the range 0.5≤x≤2) passivation layer formed on a surface of at least one of the multiple niobium leads, and an aluminum lead formed directly on at least a portion of the $NbSi_x$ passivation layer such that an interface therebetween is substantially free of oxygen and oxidized material, where the multiple niobium leads and the aluminum lead are constructed to carry a supercurrent while in use.

Another embodiment of the present invention further relates to a method of producing a superconducting device. The method forms multiple niobium leads on a substrate and forms a niobium silicide ($NbSi_x$) passivation layer on a surface of at least one of the multiple niobium leads. The method forms an aluminum lead directly on at least a portion of the $NbSi_x$ passivation layer such that an interface therebetween is substantially free of oxygen and oxidized material. The multiple niobium leads and the aluminum lead are constructed to carry a supercurrent while in use.

Another embodiment of the present invention further relates to a quantum computing system which includes a refrigeration system, and a qubit chip which includes multiple qubits. The qubit chip includes a substrate, multiple niobium leads formed on the substrate, a niobium silicide ($NbSi_x$) passivation layer formed on a surface of at least one of the multiple niobium leads, and an aluminum lead formed directly on at least a portion of the $NbSi_x$ passivation layer such that an interface therebetween is substantially free of oxygen and oxidized material, wherein the multiple niobium leads and the aluminum lead are constructed to carry a supercurrent while in use.

BRIEF DESCRIPTION OF THE DRAWINGS

Embodiments of the present invention, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Some embodiments of the current invention are discussed in detail below. In describing embodiments, specific terminology is employed for the sake of clarity. However, the invention is not intended to be limited to the specific terminology so selected. A person skilled in the relevant art will recognize that other equivalent components can be employed, and other methods developed without departing from the broad concepts of the current invention.

Superconducting technology for quantum devices often uses niobium circuit elements such as resonators or capacitors. In conventional fabrication schemes, the niobium is exposed to oxidative ambients such as air and processing chemicals. Not only can this create a substantial degree of niobium oxidation, but during any thermal processing the oxygen can be driven into the niobium, with poorly controlled effects on the niobium purity. In other words, the oxygen from the native oxide is known to dissolve into the niobium at elevated temperatures, altering the transport properties. Presently, to ameliorate these effects, native oxide must be removed by ion milling to form a good contact between the niobium and aluminum contacts, which requires additional fabrication processes.

Some embodiments of the invention discussed below refer to transmon qubits. However, other embodiments of the invention pertain to any superconducting quantum device that includes a Josephson junction, including but not limited to other types of qubits, amplifiers, filters, and resonators. Some embodiments of the invention pertain to multiple quantum devices (e.g., transmon qubits) on a single chip or other form of packaging.

Figure 1A:
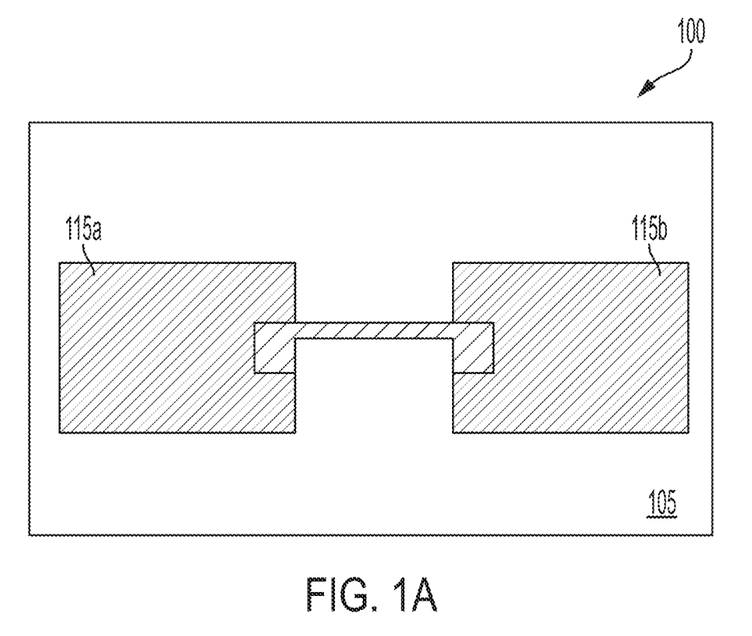
FIGS. 1A-1B are schematic diagrams of a superconducting device according to an embodiment of the present invention, that has a "passivation" layer/coating of niobium silicide ($NbSi_x$) to protect the underlying niobium from surface oxidation.
Figure 1B:
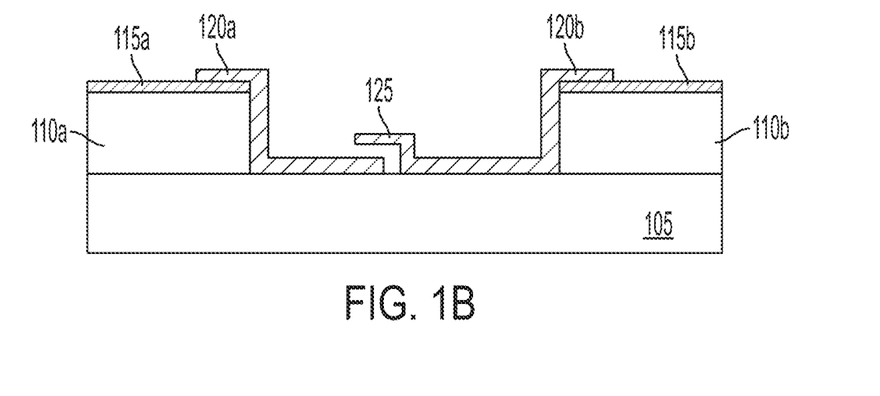

FIGS. 1A and 1B are schematic illustrations of a superconducting device 100 according to an embodiment of the present invention, in both top view (FIG. 1A) and side view (FIG. 1B). The superconducting device includes a substrate 105, multiple niobium leads 110a-110b formed on the substrate, a "passivation" layer/coating 115a of niobium silicide ($NbSi_x$, where in some embodiments the value of x is in the range $0.5 \leq x \leq 2$) formed on a surface of a first one 110a of the multiple niobium leads, and an aluminum lead 120a formed directly on at least a portion of the $NbSi_x$ passivation layer 115a. The niobium leads 110 act in some embodiments as capacitor pads for a qubit resonance circuit. The $NbSi_x$ passivation layer 115a protects the underlying niobium lead 110a from surface oxidation by greatly reducing the formation of surface oxide. In some embodiments, the $NbSi_x$ passivation layer is a thin layer with a thickness of 2 to 6 nanometers.

In some embodiments, the substrate 105 is made of semiconducting (e.g., silicon) and/or insulating (e.g., sapphire) material. However, the general concepts of the current invention are not limited to those particular materials. The term "substrate" is a monolithic structure in some embodiments, or in other embodiments a structure that may include multiple layers of material, including patterned layers.

In some embodiments, the superconducting device 100 includes a second aluminum lead 120b formed directly on at least a portion of a second $NbSi_x$ passivation layer 115b formed on a surface of a second niobium lead 110b. The niobium leads 110a-110b and aluminum leads 120a-120b are constructed to carry a supercurrent while in use. The interfaces between the passivation layers 115a-115b and the underlying niobium leads 110a-110b, and the interfaces between the passivation layers 115a-115b and the overlying aluminum leads 120a-120b, are substantially free of oxygen and oxidized material. Substantially free of oxygen and oxidized material is intended to mean an amount that is sufficiently low so that effects on a first supercurrent passing between the niobium lead 110a and the aluminum lead 120a, and on a second supercurrent passing between the niobium lead 110b and the aluminum lead 120b, are within the accepted tolerances for the particular superconducting device. Some embodiments include a quantum tunneling barrier formed between the first 120a and second 120b aluminum leads so as to form a Josephson junction 125. The superconducting device can be an amplifier, a filter, or a qubit in some embodiments. In some embodiments, the superconducting device is a quantum processor (also referred to as a qubit chip) with multiple qubits.

Figure 2:
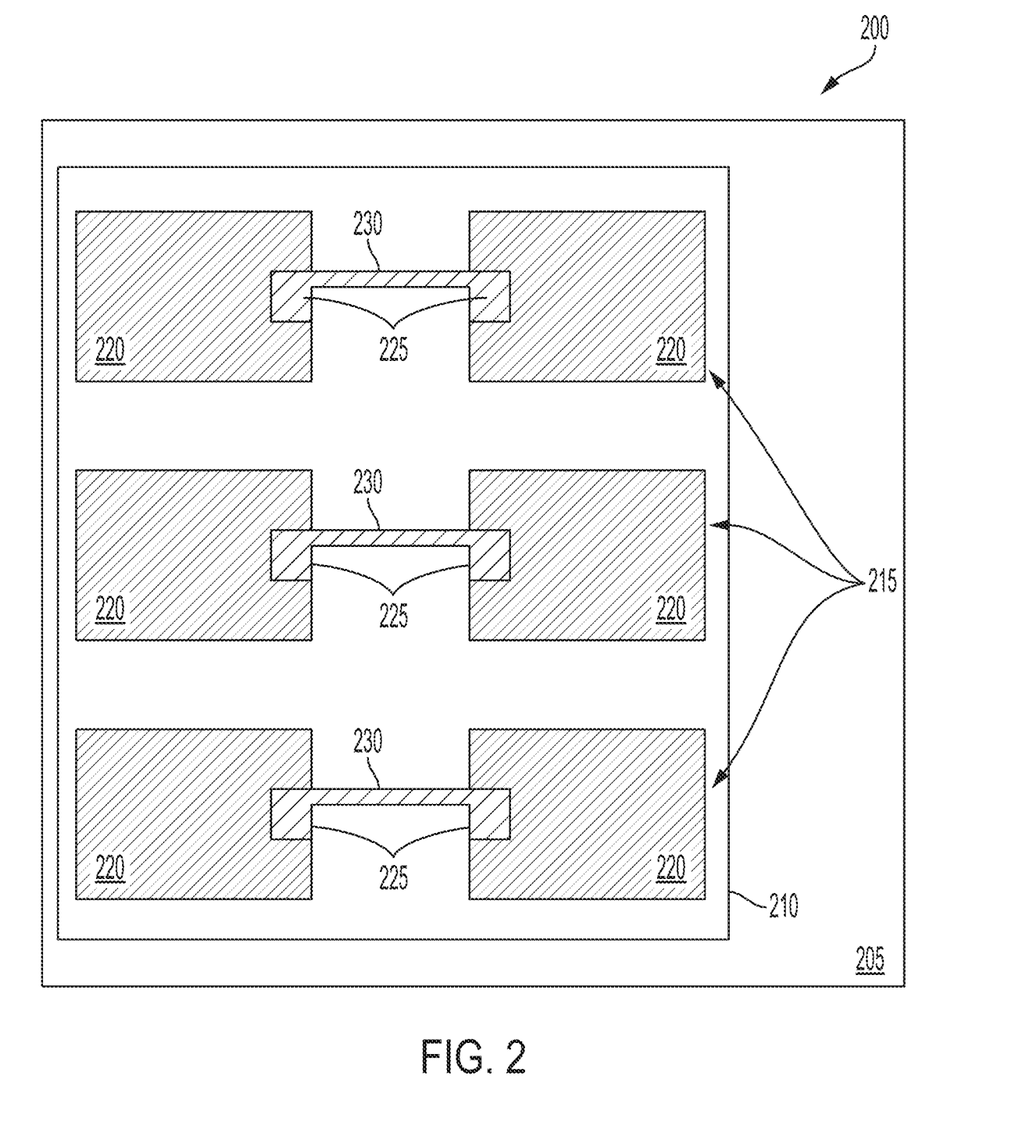
FIG. 2 is a schematic diagram of a superconducting quantum computer system, according to an embodiment of the present invention.

FIG. 2 is a schematic diagram (top view) of a superconducting quantum computer system 200, according to an embodiment of the present invention. The superconducting quantum computer system 200 includes a refrigeration system comprising a temperature-controlled vessel 205. The superconducting quantum computer 200 also includes a quantum processor 210 disposed within the temperature-controlled vessel 205. The quantum processor 210, which includes multiple qubits 215, is also referred to in some embodiments as a qubit chip. Each qubit 215 includes multiple niobium leads (not visible) formed above the qubit chip substrate, an $NbSi_x$ passivation layer 220 formed on a surface of at least one of the multiple niobium leads, and a pair of aluminum leads 225 formed directly on at least a portion of the $NbSi_x$ passivation layer such that an interface therebetween is substantially free of oxygen and oxidized material, where the multiple niobium leads and the aluminum lead are constructed to carry a supercurrent while in use.

In some embodiments, each of the aluminum leads 225 has at least one region of direct contact with a respective one of a $NbSi_x$ passivation layer 220 of the multiple niobium leads. In some embodiments, multiple pairs of aluminum leads 225 have at least one quantum tunneling barrier formed therebetween so as to form a plurality of Josephson junctions 230 (in this example, one Josephson junction per qubit 215) that are in superconducting connection with at least some of the niobium leads through the $NbSi_x$ passivation layers 220 that are substantially free of oxygen and oxidized material.

The general concepts of this invention are not limited to qubits or quantum devices that have only one Josephson junction. In some embodiments, one or more of the qubits can have two or more Josephson junctions, for example. In some embodiments, a quantum processor includes a qubit chip in a layer with an ancillary qubit chip, and an interposer chip between them, for error correction and for addressing the qubits. In an embodiment, without limitation, the qubit can be a superconducting circuit that has a Josephson junction shunted by a capacitor.

Figure 3A:
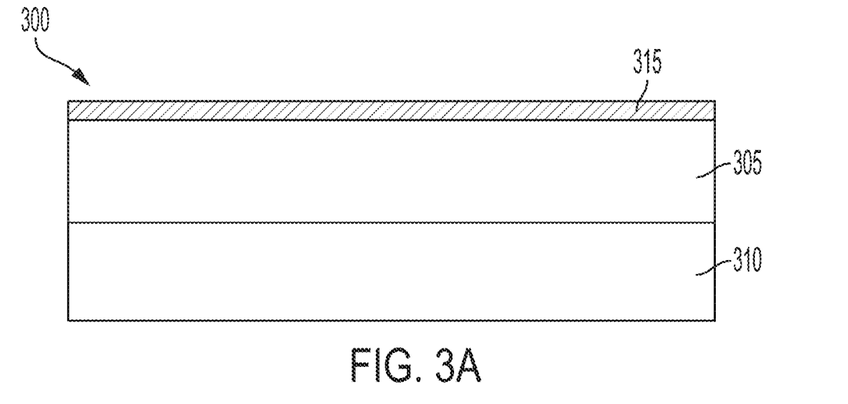
FIGS. 3A-3C schematically illustrate an embodiment where the $NbSi_x$ passivation layer is formed prior to forming the niobium leads.
Figure 3B:
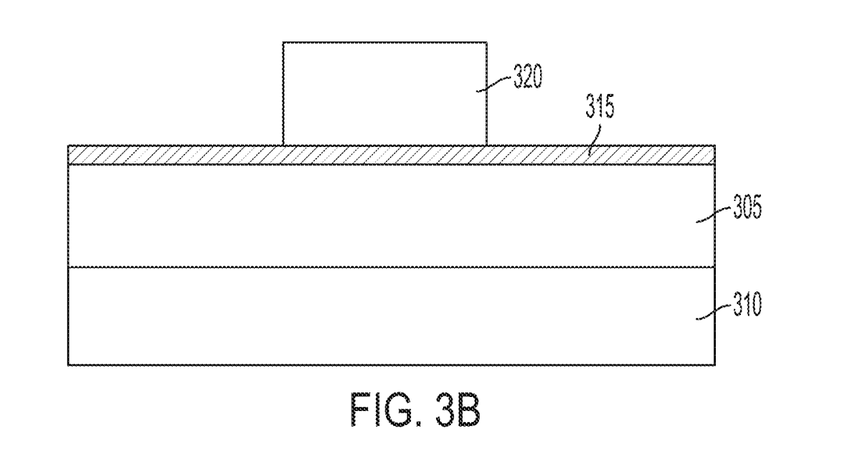
Figure 3C:
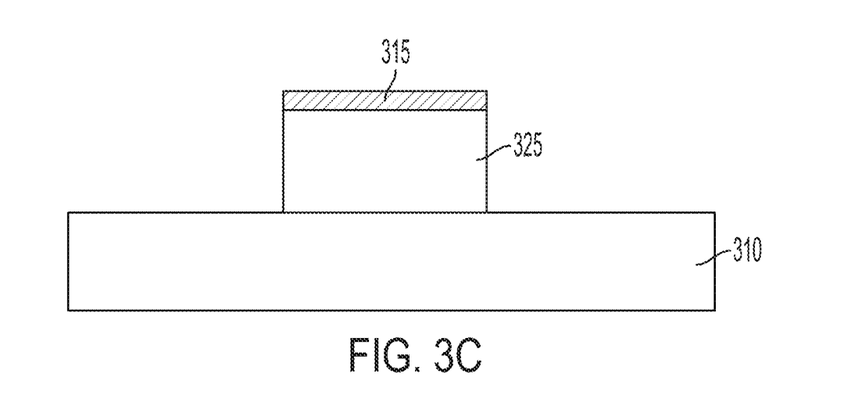

In some embodiments, the passivation layer is formed prior to forming the niobium leads, as schematically illustrated by the superconducting device 300 of FIGS. 3A-3C. As illustrated in FIG. 3A, the niobium 305 is initially deposited (e.g., by sputtering techniques) on the wafer substrate 310. The $NbSi_x$ passivation layer 315 is formed (as described below in further detail) on the surface of the deposited niobium. The niobium 310 and $NbSi_x$ 315 layers are then masked with a resist layer 320 in the pattern of the desired niobium leads 325, as illustrated in FIG. 3B. While only a single lead is illustrated in this figure, in some embodiments there are multiple such leads. The unmasked niobium is then removed, as illustrated in FIG. 3C, e.g., by conventional fabrication techniques such as reactive ion etching or wet etching, leaving behind only the desired pattern of the niobium 325 leads and corresponding $NbSi_x$ layer 315 on the substrate 310. With this approach, only the tops of the niobium leads 325 are protected by the passivation layer 315, whereas the sides of the niobium leads are potentially exposed to air.

Figure 4A:
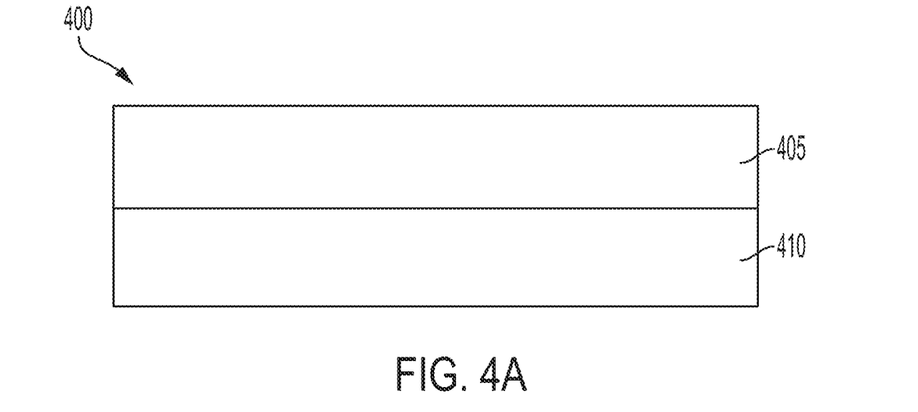
FIGS. 4A-4C schematically illustrate an embodiment where the $NbSi_x$ passivation layer is formed after forming the niobium leads.
Figure 4B:
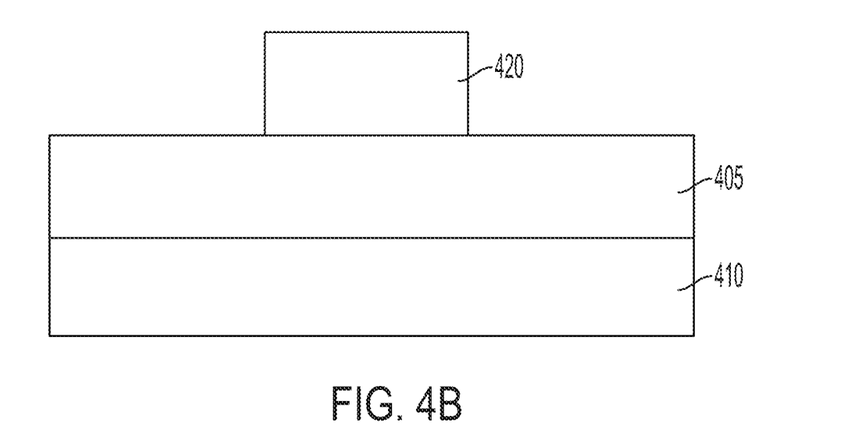
Figure 4C:
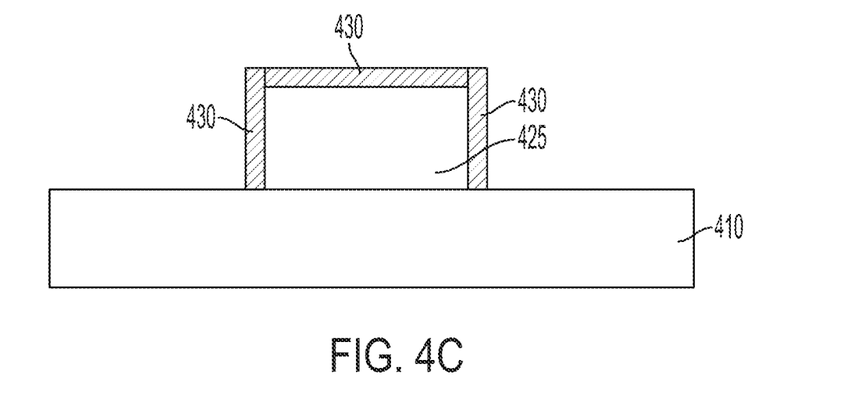

In some embodiments, the passivation layer is formed after niobium lead formation on the surface of at least one of the niobium leads, e.g. subsequent to removal of the unmasked niobium, as schematically illustrated by the superconducting device 400 of FIGS. 4A-4C. As illustrated in FIG. 4A, niobium 405 is initially deposited (e.g., by sputtering techniques) on the wafer substrate 410. The niobium layer 405 is then masked with a resist layer 420 in the pattern of the desired niobium leads 425, as illustrated in FIG. 4B. The unmasked niobium is then removed, e.g., by conventional fabrication techniques such as reactive ion etching or wet etching, leaving behind only the pattern of the niobium leads on the substrate. While only a single lead is illustrated the figure, in some embodiments there are multiple such leads. The NbSi$_x$ passivation layer 430 is then formed (as described below in further detail) on the surface of the deposited niobium, as illustrated in FIG. 4C. With this approach, all surfaces of the niobium leads 425 are encapsulated by the passivation layer 430, for full protection.

The niobium leads 110 325 425 are formed/patterned in a dedicated chamber or set of chambers in some embodiments. Niobium deposition occurs in some embodiments at temperatures between 0 C and 400 C, preferably at room temperature. To form the NbSi$_x$ passivation layer 115 315 430 510, in some embodiments the wafer is transferred to a silicon sputter deposition chamber with heated chuck, where a thin (e.g., 2 to 6 nm) silicon layer is deposited and reacted. The sample is not exposed to air in between niobium and silicon deposition, e.g. using a vacuum sealed package in some embodiments, to ensure that the NbSi$_x$ passivation layer remains substantially free of oxygen and oxidized material during the transfer.

In some embodiments, the silicon is deposited onto the surface by sputtering silicon onto the heated niobium surface in a vacuum. In some embodiments, a temperature between 300 C and 600 C is selected to facilitate the reaction between the silicon and the niobium to form the NbSi$_x$ passivation layer. The wafer is held at the selected temperature during the silicon deposition process. In some embodiments, the niobium can be exposed to silane (SiH$_4$), disilane (H$_6$Si$_2$), or other reactants.

Figure 5A:
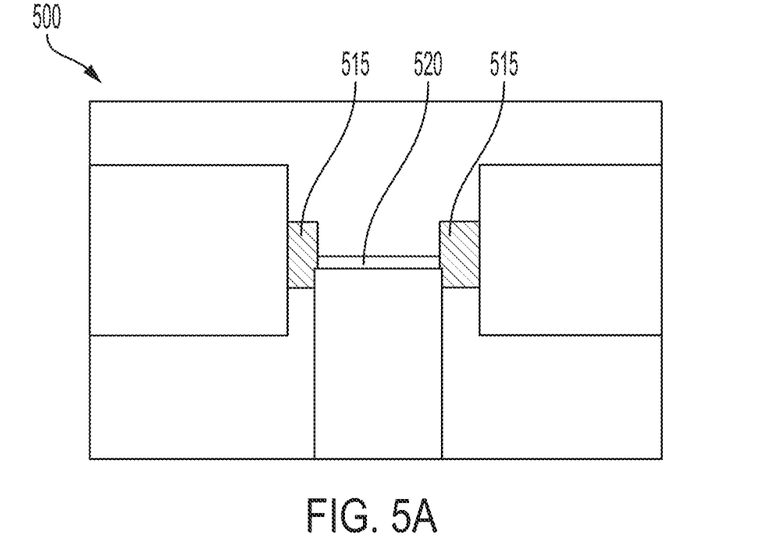
FIGS. 5A-5B schematically illustrate forming the aluminum leads and Josephson junctions, according to an embodiment of the present invention.
Figure 5B:
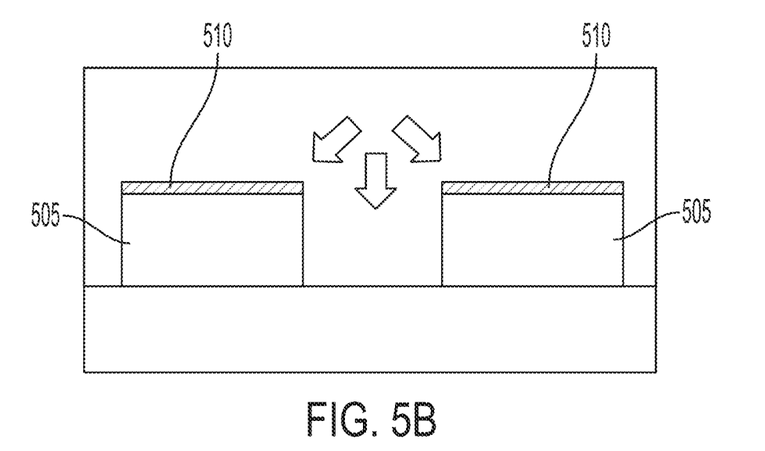

After fabrication, the wafer can proceed through a conventional qubit or device fabrication process, including forming aluminum leads and Josephson junctions, as schematically illustrated by the superconducting device 500 of FIGS. 5A-5B. In some embodiments, the niobium leads 505 and the NbSi$_x$ passivation layer 510 are masked with a resist layer 512, except for the areas 515 of the NbSi$_x$ and areas 520 of the substrate which will be the contact pads for the aluminum leads. An example of this masking is illustrated in both top view (FIG. 5A) and bottom view (FIG. 5B). Techniques for this masking include a Dolan bridge configuration, or other method such as Manhattan style, in some embodiments. The aluminum is then deposited onto the unmasked contact pads. In some embodiments, the aluminum is deposited at two oblique angles (arrows) to create the Josephson junction on the unmasked contact pads 515 and substrate 520.

Some embodiments of the invention provide various advantages over devices without a passivation layer. In some embodiments, the NbSi$_x$ passivation layer 115 315 430 510 acts as a diffusion barrier to prevent oxygen ingress into the underlying niobium. This has the benefit of stabilizing transport properties during annealing, leading to greater control of device properties.

Furthermore, the silicide can be formed in some embodiments at a low thermal budget, allowing the insertion of the NbSi$_x$ passivation layer 115 315 430 510 into a conventional processing flow with minimal perturbation of any downstream fabrication steps. For example, this would be a single step added to conventional qubit fabrication, with no other change in processing. Moreover, in some embodiments the NbSi$_x$ passivation layer 115 315 430 510 preserves the transport properties through post-annealing, closely resembling what is observed for a virgin sample.

There is a rich literature on the use of bulk niobium components for superconducting cavities for accelerators. It has been well established that impurities such as native oxides or near surface hydrogen introduced by electropolishing can have deleterious effects on resonator quality. For example, studies of niobium cavities for accelerator applications have highlighted the role of impurities in reducing resonator q.

Furthermore, it is known that annealing can cause oxygen ingress, further degrading properties. For these applications, high temperature processes can be used. However, less is known about how to prevent degradation of thin films, where superconductor-substrate interactions must be avoided. Furthermore, surface oxides can interfere with the formation of superconductor-superconductor contacts.

To investigate some embodiments of the invention, initial experimental tests were performed on blanket niobium films created by sputtering at room temperature. Subsequently, wafers were transferred to a heated wafer chuck in a silicon deposition chamber with no air exposure. Thin silicon capping layer were then deposited at room temperature, 400 C, and 550 C, with thicknesses varying between 1 and 8 nanometers (nm). Additional parameters for the silicon sputtering methodology are listed in Table I. Control samples were also subjected to the same temperatures on the heated wafer chuck, with no silicon deposition. The temperatures were a compromise between forming a surface silicide without a reaction with the underlying silicon, which is known happen above 650 C.

TABLE I

Silicon sputter deposition parameters. These parameters are with a pulsed DC magnetron sputtering at 200 W, using argon working gas at 3.1 mT. The deposition rate is approximately 2.2 Å/s (0.22 nm/s).

| Thickness (Å) | Deposition time (s) |
| --- | --- |
| 10 | 4.5 |
| 20 | 9.1 |
| 30 | 13.7 |
| 40 | 18.2 |
| 50 | 22.8 |
| 80 | 36.6 |

Figure 6:
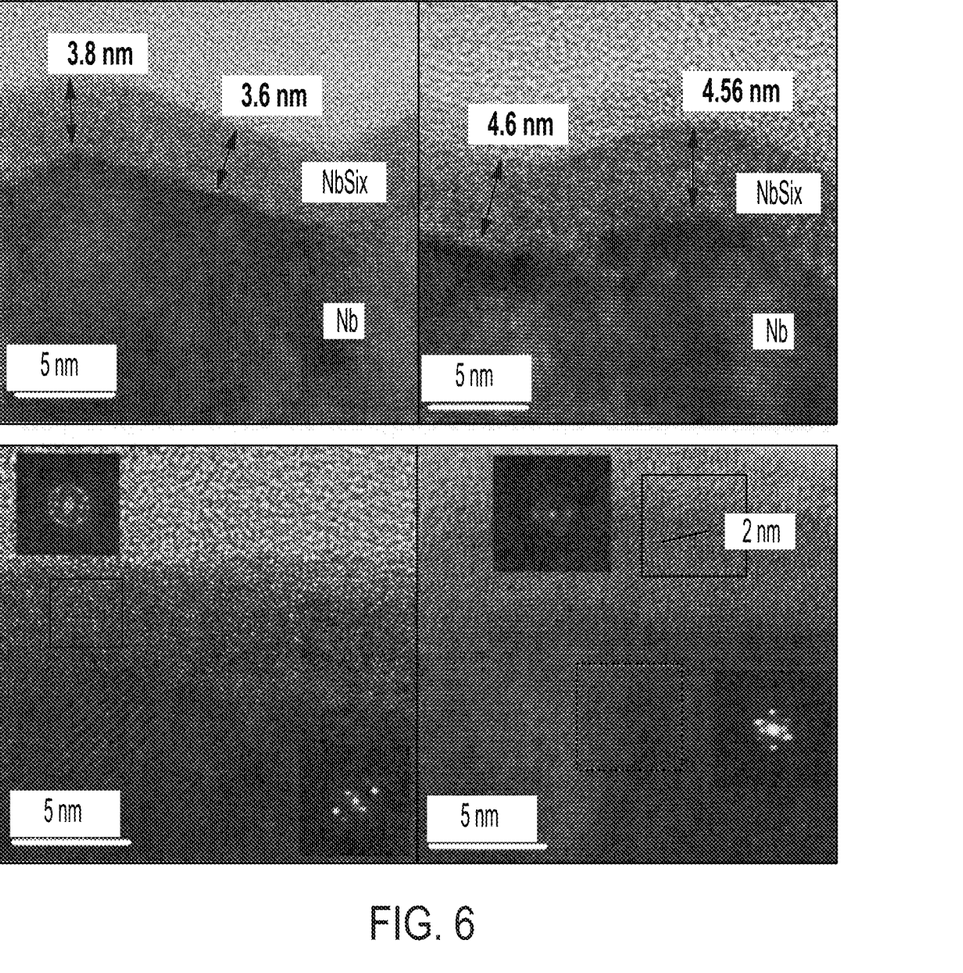
FIG. 6 illustrates cross-sectional transmission electron microscope (TEM) images to validate that a conformal surface silicide was formed, according to an embodiment of the present invention.

FIG. 6 illustrates cross-sectional transmission electron microscope (TEM) images to validate that a conformal surface silicide was formed, even at 400 C. For example, deposition of a nominal 4 nm Si layer at 400 C (as illustrated in upper left) results in a continuous, largely amorphous layer of 3.6-3.8 nm covering the niobium 210. There is no evident niobium oxide in the cap layer, which is 45% silicon. The same thickness Si deposited at 550 C resulted in a 4.6 nm silicide layer (as illustrated in upper right). Further inspection revealed the presence of nanometer-scale crystallites at 400 C (as illustrated in lower left), which are larger and better defined in the higher temperature film at 500 C (as illustrated in lower right).

Figure 7A:
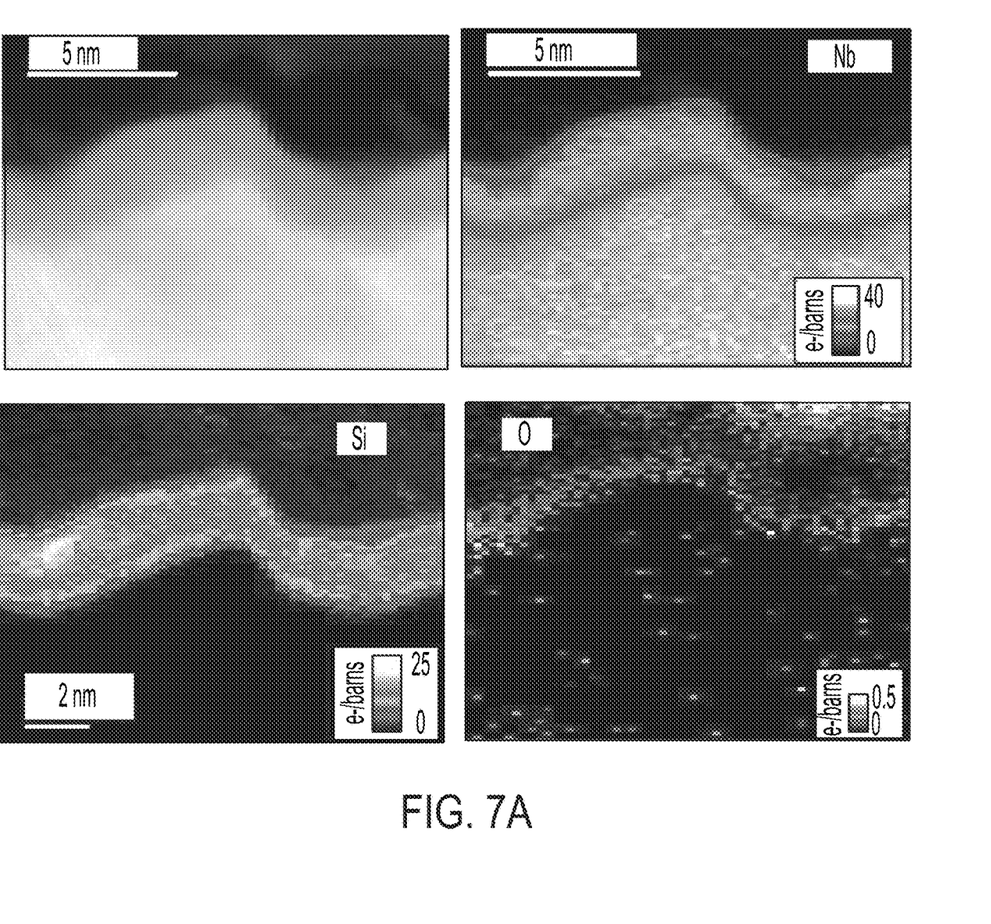
FIGS. 7A-7B illustrate elastic electron loss spectroscopy (EELS) mapping to demonstrate that both niobium and silicon are present in the amorphous layer, according to an embodiment of the present invention.
Figure 7B:
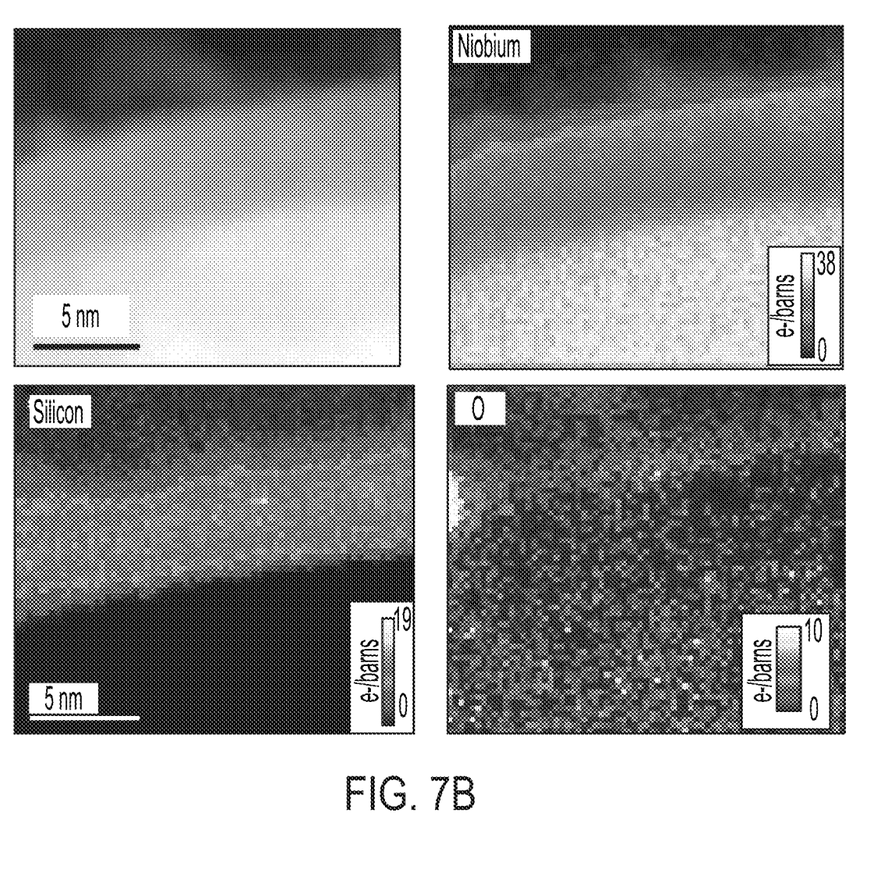

FIGS. 7A and 7B illustrate elastic electron loss spectroscopy (EELS) mapping to demonstrate that both niobium (Nb) and silicon (Si) are present in the amorphous layer, with a thin oxide layer at the surface of the coating. Quantitative analysis of the Si content in the 400 C (FIG. 7A) and 550 C (FIG. 7B) films gave respective peak concentrations of 45% and 40% relative to Nb, with a gradient decreasing into the Nb bulk. There was a significant roughness to the Nb surface, which limited the accuracy of the concentration, which is average through the thickness of the cross-sectional slice.

Figure 8:
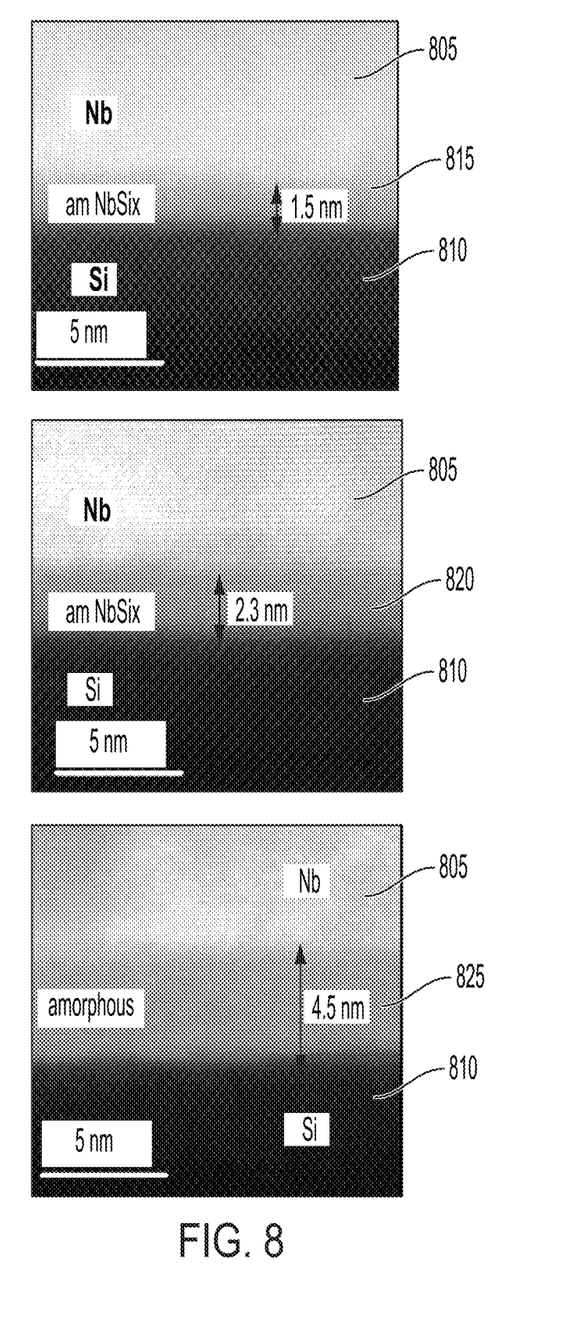
FIG. 8 illustrates TEM images of an amorphous interlayer whose width increased with thermal processing, according to an embodiment of the present invention.

One area of potential concern was with limiting the extent of Nb-substrate reaction. FIG. 8 illustrates TEM images of an amorphous interlayer between the niobium 805 and the silicon substrate 810, whose width increased with thermal processing. A 1.5 nm layer 815 of amorphous silicide was observed after deposition at 400 C. The layer 820 grew to 2.3 nm after a 400 C post-anneal. A much thicker layer 825 of 4.5 nm was seen after 550 C deposition. Accordingly, although a more complete surface reaction is expected at high temperatures, it comes at the price of creating a thicker interfacial silicide.

Figure 9:
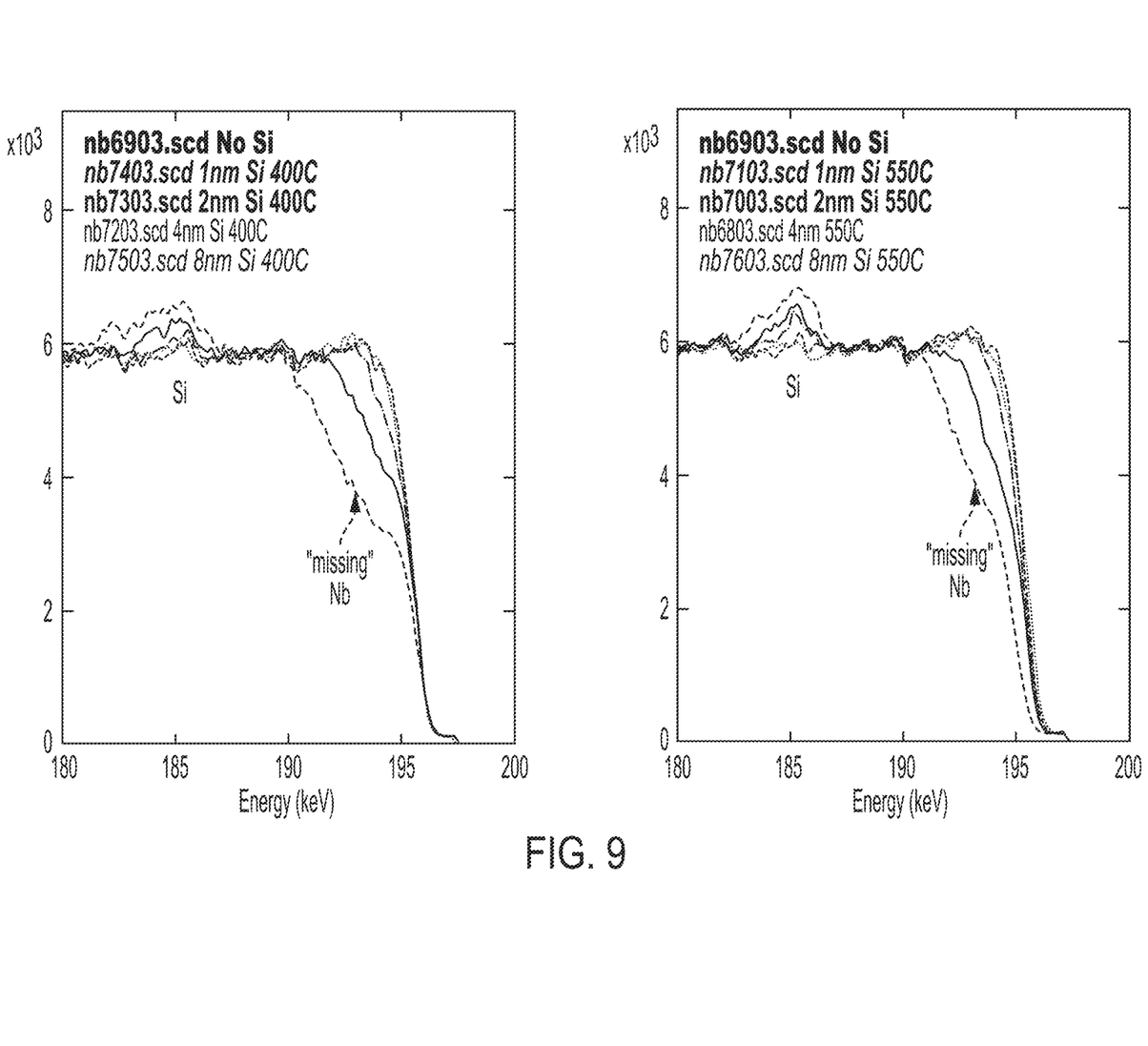
FIG. 9 illustrates a medium energy ion scattering (MEIS) plot with features that indicate the presence of a silicide, according to an embodiment of the present invention.

Additional information on the composition of the near surface region can be gained with medium energy ion scattering (MEIS). This form of high-resolution Rutherford backscattering gives quantitative analysis on a nanometer depth-scale, making it highly suitable for the analysis of ultra-thin films. FIG. 9 illustrates an MEIS plot with features that indicate the presence of a silicide. In this case, 200 keV protons were used. First, there is the shape of the niobium leading edge at 195.7 keV. In the absence of a silicide, this takes a sharp character, resembling a step function. When the niobium is diluted by silicon, or another species such as oxygen, the backscatter intensity is reduced. Thus, the depressed region near the leading edge, labeled "missing niobium" signals a surface layer with a lower niobium content. The depth of the depression at the niobium leading edge measures the niobium concentration, and the width of the depression measures the silicide thickness. The spectra also contain a weak feature at 186.1 keV due to backscattering from silicon. Since the niobium cross section is 8.6× larger than the silicon cross section, even a high silicon concentration will cause a relatively small peak. Furthermore, a silicon signal increased in intensity as more silicide was created. The silicide was thinner, and more silicon-rich at 400 C (left) compared to 550 C (right). This suggests that the silicidation is kinetically limited, a consequence of the restricted thermal budget. For the thickest silicon layer (8 nm), the niobium leading edge is shifted to lower energy. In this extreme, the silicon is unable to fully react with the niobium, and an unreacted layer lies near the surface.

Figure 10:
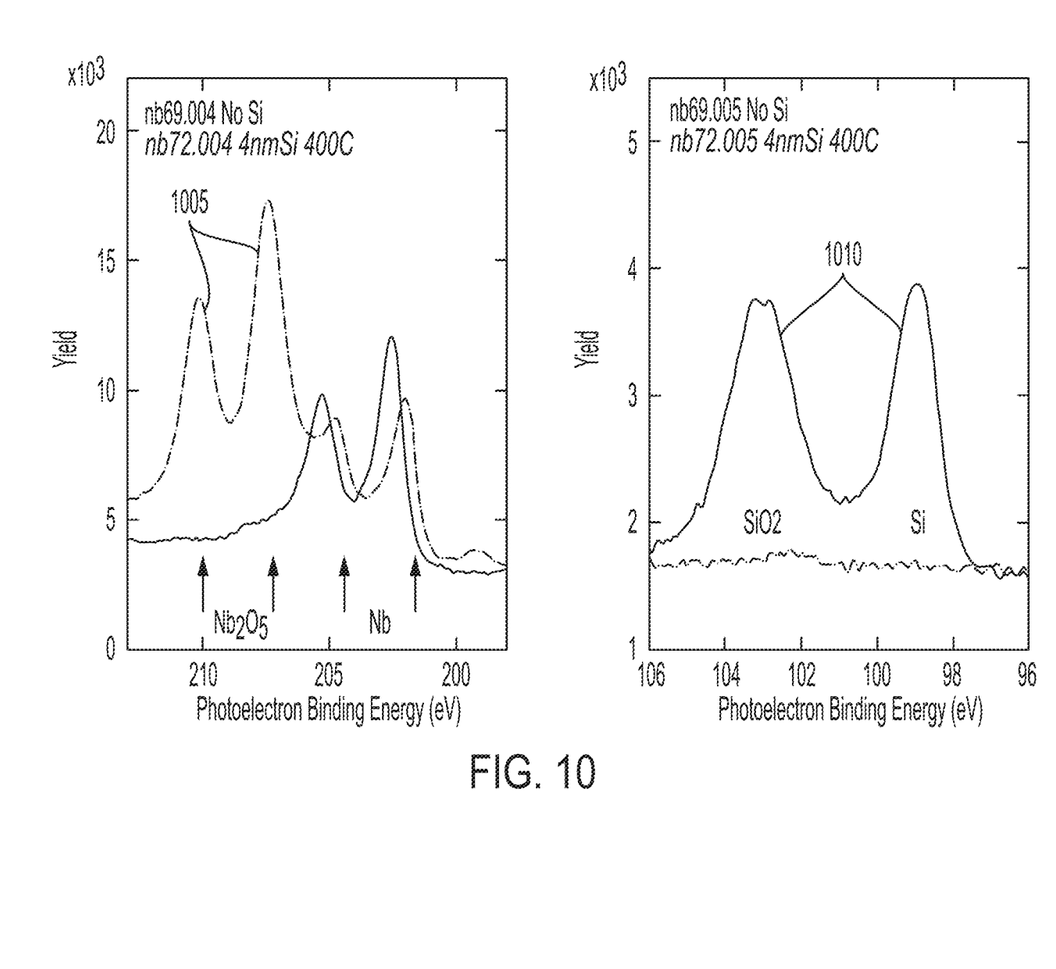
FIG. 10 illustrates x-ray photoelectron spectroscopy (XPS) of niobium and silicide core levels that show protection of niobium from oxidation, according to an embodiment of the present invention.

FIG. 10 illustrates x-ray photoelectron spectroscopy (XPS) of niobium and silicide core levels that show protection of niobium from oxidation by niobium silicide. These XPS results illustrate a comparison between bare niobium and 4 nm of silicon deposited at 400 C. The niobium peak (left) shows that the oxidized niobium (e.g., $Nb_2O_5$) peaks 1005 are nearly absent after passivation. A slight shift is evident in the niobium spectrum due to the silicide formation. The silicon peak (right) shows that the silicon coating (Si and thin $SiO_2$ surface layer) peaks 1010 are absent prior to passivation and present after passivation. Silicide is also visible.

With regard to the impact on devices, a tighter distribution of resonator frequencies is expected in some embodiments. Qubit frequency effects are uncertain, since the causes of frequency shifts are largely conjecture. If qubit drift is determined by the Josephson junction, there will not be substantial improvement. There could be large differences in losses at the metal-air interface, although it is uncertain how large an effect the M/A interface has on Q.

Both TEM and XPS show that a very thin $SiO_2$ layer forms (approx. 1 nm). This is about 5× thinner than a typical niobium native oxide, so a reduction in the ion milling required for a low-loss Al/Nb contact is anticipated.

Figure 11A:
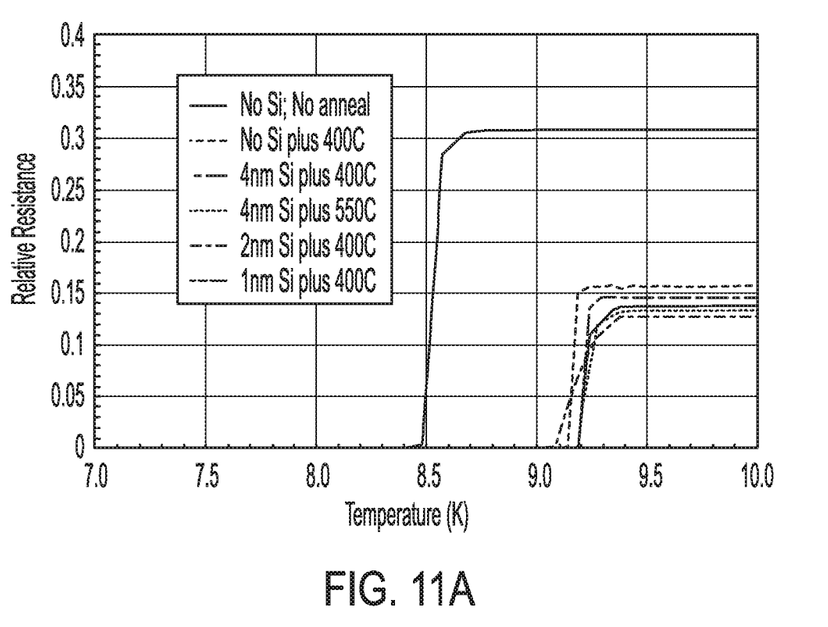
FIGS. 11A-11B illustrate the impact of the passivation layer on niobium properties in practice, according to an embodiment of the present invention.
Figure 11B:
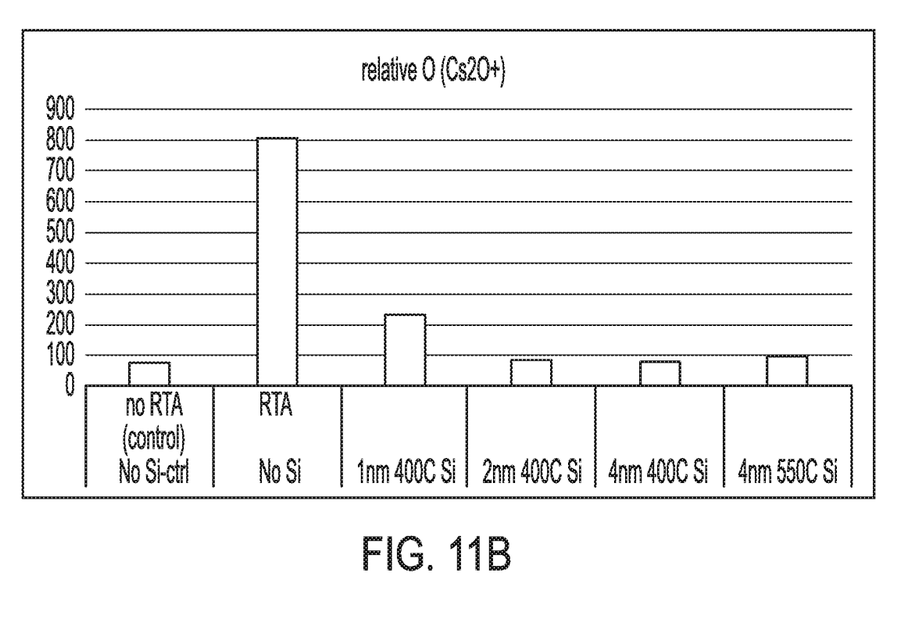

FIGS. 11A-11B illustrate the impact of the $NbSi_x$ passivation layer 115 315 430 510 on the properties of the niobium in practice. FIG. 11A illustrates transport measurements which demonstrate preservation of niobium critical temperature Tc after annealing, by comparing resistance measurements of capped and uncapped niobium films. Capped films have a tight distribution of the Tc centered at 9.2K, with a residual resistivity ratio (RRR) of ~7. Without a capping layer, Tc is reduced to 8.5k, and the RRR drops to 3.3.

FIG. 11B illustrates SIMS measurements of oxygen content which demonstrate that oxygen is kept out of the niobium by the passivation layer 115 315 430 510. For capping layers containing more than 1 nm Si, the oxygen levels are 10× lower than uncapped niobium 110. This is comparable to a baseline sample that has not been heated.

The descriptions of the various embodiments of the present invention have been presented for the purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed therein.

We claim:

1. A superconducting device, comprising:
   a substrate;
   a plurality of niobium leads formed on said substrate;
   a niobium silicide ($NbSi_x$) passivation layer formed on a surface of at least one of said plurality of niobium leads, wherein x is in a range from 0.5 to 2; and
   an aluminum lead formed directly on at least a portion of said $NbSi_x$ passivation layer such that an interface therebetween is substantially free of oxygen and oxidized material,
   wherein said plurality of niobium leads and said aluminum lead are constructed to carry a supercurrent while in use.

2. The superconducting device of claim 1, further comprising:
   a second aluminum lead formed directly on at least a portion of a $NbSi_x$ passivation layer formed on a surface of a second one of said plurality of niobium leads such that an interface therebetween is substantially free of oxygen and oxidized material; and
   a quantum tunneling barrier formed between said first and second aluminum leads so as to form a Josephson junction.

3. The superconducting device of claim 1, further comprising a plurality of aluminum leads each having at least one region of direct contact with a respective one of a $NbSi_x$ passivation layer of said plurality of niobium leads,
   wherein a plurality of pairs of said plurality of aluminum leads have at least one quantum tunneling barrier formed therebetween so as to form a plurality of Josephson junctions that are in superconducting connection with at least some of said plurality of niobium leads through said $NbSi_x$ passivation layers that are substantially free of oxygen and oxidized material.

4. The superconducting device of claim 1, wherein the $NbSi_x$ passivation layer has a thickness of 2 to 6 nanometers.

5. The superconducting device of claim 1, wherein the superconducting device is one of an amplifier, a filter, and a qubit.

6. A quantum computing system, comprising:
  a refrigeration system; and
  a qubit chip comprising a plurality of qubits, said qubit chip comprising:
    a substrate;
    a plurality of niobium leads formed on said substrate;
    a niobium silicide ($NbSi_x$) passivation layer formed on a surface of at least one of said plurality of niobium leads, wherein x is in a range from 0.5 to 2; and
    an aluminum lead formed directly on at least a portion of said $NbSi_x$ passivation layer such that an interface therebetween is substantially free of oxygen and oxidized material,
    wherein said plurality of niobium leads and said aluminum lead are constructed to carry a supercurrent while in use.

7. The quantum computing system of claim 6, wherein the substrate is one of a semiconducting material and an insulating material, and wherein the $NbSi_x$ passivation layer has a thickness of 2 to 6 nanometers.

8. The quantum computing system of claim 6, wherein each of said plurality of qubits comprises a pair of aluminum leads and a quantum tunneling barrier to form respective Josephson junctions, each aluminum lead of each said pair of aluminum leads being formed directly on at least a portion of a $NbSi_x$ passivation layer of at least one of said plurality of niobium leads such that each interface therebetween is substantially free of oxygen and oxidized material.

* * * * *